(12) United States Patent
Mukherjee et al.

(10) Patent No.: US 10,819,396 B2
(45) Date of Patent: Oct. 27, 2020

(54) APPARATUS FOR DIE-TO-DIE COMMUNICATION

(71) Applicant: TEXAS INSTRUMENTS INCORPORATED, Dallas, TX (US)

(72) Inventors: Subhashish Mukherjee, Bangalore (IN); Venugopal Gopinathan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/773,615

(22) Filed: Jan. 27, 2020

(65) Prior Publication Data

US 2020/0162130 A1    May 21, 2020

Related U.S. Application Data

(60) Division of application No. 15/454,797, filed on Mar. 9, 2017, now Pat. No. 10,547,352, which is a continuation of application No. 15/244,929, filed on Aug. 23, 2016, now Pat. No. 9,596,008, which is a continuation of application No. 14/289,895, filed on May 29, 2014, now abandoned.

(30) Foreign Application Priority Data

May 29, 2013 (IN) .......................... 2345/CHE/2013

(51) Int. Cl.
| | |
|---|---|
| *H04B 5/00* | (2006.01) |
| *H01L 23/66* | (2006.01) |
| *H03B 5/08* | (2006.01) |
| *H01L 23/64* | (2006.01) |

(52) U.S. Cl.
CPC ......... *H04B 5/0093* (2013.01); *H01L 23/645* (2013.01); *H01L 23/66* (2013.01); *H03B 5/08* (2013.01); *H04B 5/0075* (2013.01); *H01L 2223/6677* (2013.01)

(58) Field of Classification Search
CPC ........... H01L 23/645; H01L 2924/3011; H01L 23/66; H01L 2223/6677; H04B 5/0037; H04B 1/16; H04B 5/0093; H04B 5/08; H04B 5/0075
See application file for complete search history.

(56) References Cited

U.S. PATENT DOCUMENTS

| | | | |
|---|---|---|---|
| 6,378,774 B1 | 4/2002 | Emori et al. | |
| 6,837,438 B1 | 1/2005 | Takasugi et al. | |
| 8,810,322 B2 * | 8/2014 | Rangarajan | ............ H03B 21/00 331/46 |
| 9,596,008 B2 | 3/2017 | Mukherjee et al. | |

(Continued)

OTHER PUBLICATIONS

Sang Wook Han, "Wireless Interconnect using Inductive Coupling in 3D-ICs", a dissertation, University of Michigan, 2012, 133 pages.

*Primary Examiner* — Nhan T Le
(74) *Attorney, Agent, or Firm* — Michael A. Davis, Jr.; Charles A. Brill; Frank D. Cimino

(57) ABSTRACT

In described examples, a first die includes a primary LC tank oscillator having a natural frequency of oscillation to induce a forced oscillation in a secondary LC tank oscillator of a separate second die via a magnetic coupling between the primary LC tank oscillator and the secondary LC tank oscillator.

12 Claims, 8 Drawing Sheets

(56) References Cited

U.S. PATENT DOCUMENTS

| | | |
|---|---|---|
| 10,541,649 B2 * | 1/2020 | Hekmat .................. H03L 7/099 |
| 2006/0071714 A1 | 4/2006 | Ramaswamy et al. |
| 2006/0151614 A1 | 7/2006 | Nishizawa et al. |
| 2009/0203314 A1 | 8/2009 | Noel |
| 2011/0006460 A1 | 1/2011 | Vander Wel et al. |
| 2013/0307630 A1 * | 11/2013 | Ma ....................... H03B 5/1243 |
| | | 331/34 |
| 2014/0183691 A1 | 7/2014 | Saraswat et al. |
| 2014/0274395 A1 | 9/2014 | Ellsworth |
| 2015/0381157 A1 * | 12/2015 | Andreani ................. H03B 5/24 |
| | | 331/117 FE |

* cited by examiner

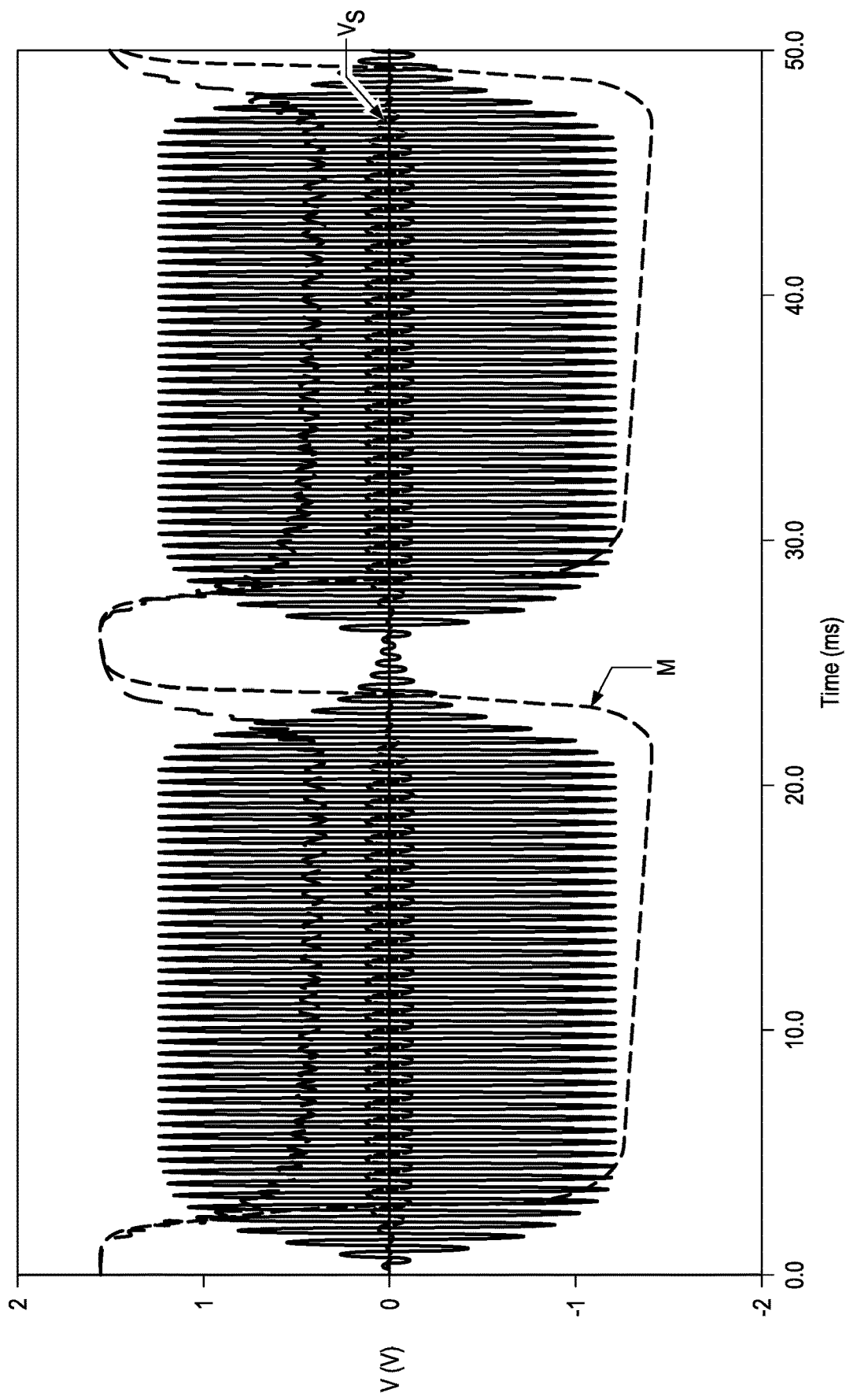

APPARATUS FOR DIE-TO-DIE COMMUNICATION

CROSS-REFERENCE TO RELATED APPLICATIONS

This application is a divisional of U.S. patent application Ser. No. 15/454,797 filed Mar. 9, 2017, which is a continuation of U.S. patent application Ser. No. 15/244,929 filed Aug. 23, 2016 (issued as U.S. Pat. No. 9,596,008), which is a continuation of U.S. patent application Ser. No. 14/289,895 filed May 29, 2014, which claims priority to India Patent Application No. 2345/CHE/2013 filed May 29, 2013, all of which are hereby fully incorporated herein by reference for all purposes.

BACKGROUND

This relates generally to electronic circuits, and more particularly to a method and apparatus for die-to-die communication.

In formation of an integrated circuit, a number of active and passive semiconductor devices are fabricated within dies on a wafer. In a multi-chip module (MCM), multiple dies are mounted on a shared substrate or board. The MCM includes various numbers and combinations of semiconductor devices, such as processing devices, memory devices and wireless communication devices. In one example, between the semiconductor devices on a first die and semiconductor devices on a second die, the electrical isolation is potentially 1000 s of volts. For die-to-die communication, example solutions include opto-couplers, radiative RF couplers, capacitive couplers and transformer couplers. However, those solutions have shortcomings. The performance of opto-couplers is degraded because of a large variation in their current transfer ratios and because of aging related issues. Radiative RF couplers use very high frequency (e.g., greater than 60 GHz) for die-to-die communication. Also, they are relatively expensive to build, and their efficiency is low at low data rates due to system overhead. Capacitive couplers and transformer couplers have metal plates associated with each die, which have various shortcomings, such as: (a) imposing a requirement of close proximity between those metal plates; (b) an amount of electrical isolation being dependent on a material between the metal plates; (c) maximum voltage tolerance being limited by spacing between the metal plates; and/or (d) higher cost from a special die or a printed circuit board (PCB) for implementation of the die-to-die communication.

SUMMARY

In described examples, a first die includes a primary LC tank oscillator having a natural frequency of oscillation configured to induce a forced oscillation in a secondary LC tank oscillator of a separate second die via a magnetic coupling between the primary LC tank oscillator and the secondary LC tank oscillator.

BRIEF DESCRIPTION OF THE DRAWINGS

FIGS. 4A-4C are graphs of modulation operations performed in the apparatus of FIG. 1.

DETAILED DESCRIPTION OF EXAMPLE EMBODIMENTS

Figure 1:
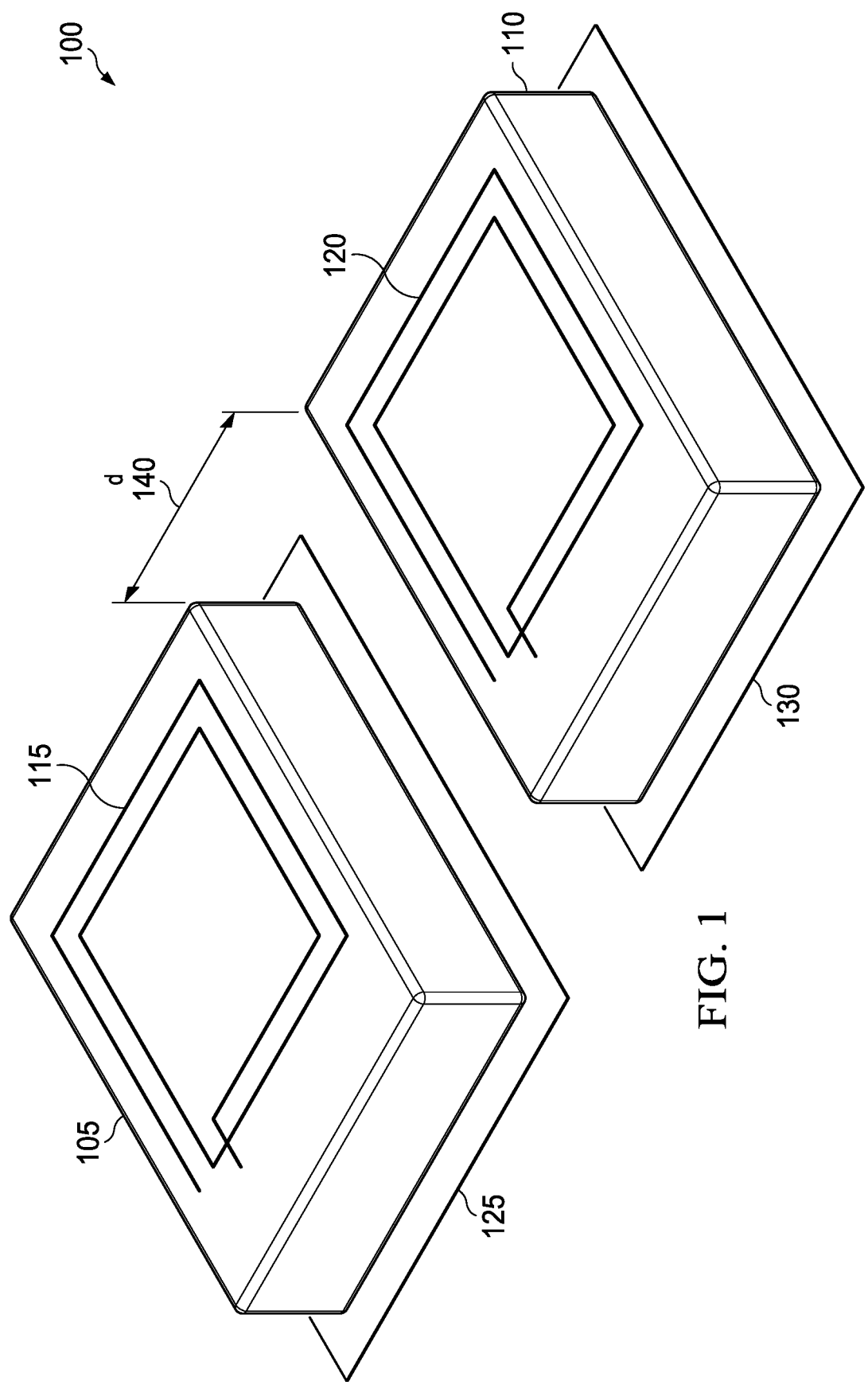
FIG. 1 is a structural perspective view of apparatus, according to an embodiment.

FIG. 1 is a structural perspective view of apparatus 100, according to an embodiment. The apparatus 100 includes at least a first die 105 and a second die 110. The first die 105 and the second die 110 are illustrative, and the apparatus 100 may include multiple die and other active/passive components. The first die 105 includes at least a first circuit 115, and the second die 110 includes at least a second circuit 120.

In a first embodiment, the first die 105 is integral with a first conductive pad 125, and the second die 110 is integral with a second conductive pad 130. The first conductive pad 125 and the second conductive pad 130 both include multiple grooves to substantially prevent eddy current formation on the first conductive pad 125 and the second conductive pad 130 respectively. In a second embodiment, the first die 105 is integral with a first substrate (or chip) 125, and the second die 110 is integral with a second substrate (or chip) 130. In a third embodiment, the first conductive pad 125 and the second conductive pad 130 both include multiple cuts to substantially prevent eddy current formation on the first conductive pad 125 and the second conductive pad 130 respectively. In a fourth embodiment, when each of the first die 105 and the second die 110 are integral with a non-conductive pad, the non-conductive pad may optionally omit the multiple grooves.

In one example, the first die 105 and the second die 110 are integral with a laminate, which substantially prevents eddy current formation. In a further example, the first die 105 and the second die 110 are part of different packages, which are part of a PCB. In another example, the apparatus 100 is integral with an MCM, so that the first die 105 and the second die 110 are on a single chip in the MCM. In a different example, the apparatus 100 is integral with an MCM, so that the first die 105 and the second die 110 are part of different chips in the MCM. In yet another example, the apparatus 100 is integral with a PCB.

In one version, the first die 105 is symmetrical with the second die 110, so that dimensions (e.g., length, width and height) of the first die 105 are same as dimensions of the second die 110. The first die 105 is coplanar to the second die 110, so that the first die 105 and the second die 110 are in same plane. The first die 105 and the second die 110 are positioned such that: (a) first surfaces of the first die 105 and the second die 110 are on a chip (125 or 130); and (b) second surfaces (opposite from the first surfaces) of the first die 105 and the second die 110 are active surfaces containing the first circuit 115 and the second circuit 120 respectively. In an embodiment, the first circuit 115 is coplanar to the second circuit 120. The first die 105 and the second die 110 are separated by a fixed distance (d) 140. In one example, the fixed distance (d) 140 is more than 0.5 mm. In a further example, the fixed distance (d) 140 varies from 0.5 mm to 1 mm (millimeters). In another example, the fixed distance (d) 140 is such that a high voltage isolation (e.g., above 1.5 kilovolt) is maintained between the first die 105 and the second die 110.

The first circuit 115 and the second circuit 120 include respective antenna coils with non-radiative dimensions (e.g., non-radiative when an electrical length of the antenna coil is less than one-eighth of an operating wavelength of the apparatus 100). In one example, the first circuit 115 is on-chip, and its antenna coil is integral with a laminate. In another example, the antenna coil is a flat coil (e.g., flat spiral coil) having N number of loops in one plane, where N is an integer. In one version, the second die 110 is on top of the first die 105, so that an active surface of the first die 105 is facing an active surface of the second die 110, and each of those active surfaces contains its respective antenna coil. In one embodiment, the first die 105 and the second die 110 are integral with a first package and a second package respectively. In a further example, the second package is on top of the first package, such that the active surface of the first die 105 is facing the active surface of the second die 110.

In an embodiment, the loops of the antenna coil and a capacitor together operate as an LC tank (inductor capacitor tank) oscillator. In one example, each of the first circuit 115 and the second circuit 120 includes a respective LC tank oscillator that is formed by a set of inductors and a set of capacitors. Also, each of the first circuit 115 and the second circuit 120 includes a respective transmitter and a respective receiver, which are used for communication between the first die 105 and the second die 110.

The first circuit 115 is coupled to an energy source (not shown in FIG. 1), such as a voltage source or a current source. In a first example, the first die 105 includes the energy source. In a second example, the energy source is external to the first die 105. In a third example, the energy source is external to the apparatus 100.

During operation of the apparatus 100, in response to a signal (e.g., current signal and/or voltage signal) from an energy source (which is coupled to the first circuit 115), the first circuit 115 induces a current in the second circuit 120 via a magnetic coupling between the first circuit 115 and the second circuit 120. In one example, the signal is a periodic pulse of energy. The signal (provided to and received by the first circuit 115) is modulated for communication between the first die 105 and the second die 110. In an embodiment, the signal is provided to the first circuit 115 by an energy source on the first die 105.

For example, when the signal is a current, the current to the first circuit 115 is modulated using one of various modulation techniques, such as (but not limited to) on-off keying modulation, phase shift keying (PSK) modulation, amplitude modulation, phase modulation, quadrature phase shift keying (QPSK) modulation, and binary phase shift keying (BPSK) modulation. In on-off keying modulation, a combination of 0 s and 1 s are used for modulating the current. In one example, an input for the on-off keying modulation is one of: 010101; 000010000100001; and 11110111101111. In an embodiment, the signal provided to the first circuit 115 represents one or more bits. For example, in one embodiment, when the first circuit 115 receives a periodic pulse of energy, one pulse of energy represents one bit that is to be transmitted from the first die 105 to the second die 110.

In one embodiment, the first circuit 115 and the second circuit 120 are oscillators, such as LC tank oscillators, operating at a fixed frequency. A magnetic coupling between the first circuit 115 and the second circuit 120 induces a current in the second circuit 120. Accordingly, the first circuit 115 and the second circuit 120 operate as magnetically coupled oscillators at the fixed distance (d) 140. In an example, such oscillators are injection locked oscillators. The magnetically coupled first circuit 115 and the second circuit 120 establish a near-field communication channel, which is suitable for use in high speed communication.

The first circuit 115 and the second circuit 120 operate at the fixed frequency. In one example, the fixed frequency has a low gigahertz range (e.g., less than 3 GHz), so that the apparatus 100 is not required to perform high frequency (e.g., more than 60 GHz) signal processing. In an embodiment, the antenna coil is designed to maximize a coupling between the first die 105 and the second die 110 when a quality factor (Q) is 10 and the fixed frequency is less than 3 GHz.

In an example, the first circuit 115 and the second circuit 120 operate as LC tank oscillators. The LC tank oscillator in the first circuit and the LC tank oscillator in the second circuit are configured to operate at the fixed frequency. A high speed communication is achieved between the first die 105 and the second die 110, such as a communication whose speed is faster than 500 Mb/s (megabits per second) and whose power consumption is relatively low at less than 10 mA current. In an embodiment, the first die 105 and the second die 110 include various circuit components for performing multiple tasks, which may continue uninterrupted during communication between the first circuit 115 and the second circuit 120. For example, in a microprocessor with the apparatus 100, the microprocessor performs multiple tasks, which may continue uninterrupted even while the apparatus 100 operates as a wireless IO (input/output) for communication with other devices. In a first example, the wireless IO is performed concurrently with those multiple tasks. In a second example, the wireless IO is performed during periods that are non-overlapping with those multiple tasks. Further operation of the apparatus 100 is discussed in connection with FIG. 3.

Figure 2:
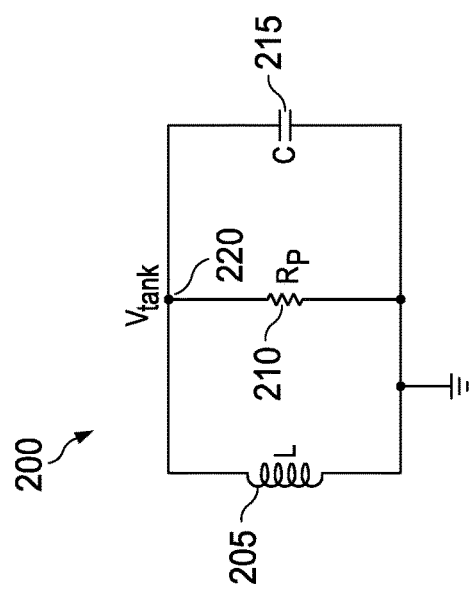
FIG. 2 is a schematic diagram of an LC tank oscillator.

FIG. 2 is a schematic diagram of an LC tank oscillator 200. The LC tank oscillator 200 includes an inductor (L) 205 and a capacitor (C) 215. The voltage across the LC tank oscillator 200 is $V_{tank}$ 220. The LC tank oscillator 200 oscillates at a frequency f. The voltage decays due to a quality factor (Q) of the tank, which is represented as a resistor (Rp) 210. When the voltage across the LC tank oscillator 200 is maximum, so that $V_{tank}$ is at peak, an energy contained in the LC tank oscillator 200 is:

$$E = \frac{1}{2} * C * V_{tank}^2 \quad (1)$$

Q is computed as:

$$Q = 2\pi \frac{\text{Maximum Enery Stored}(E)}{\text{Power loss }(P) \times \left(\frac{1}{f}\right)} \quad (2)$$

where f is a frequency of the LC tank oscillator 200. Accordingly, P is the power loss or the power needed to sustain oscillation in the LC tank oscillator 200, which is:

$$P = \frac{2\pi f \times \frac{1}{2} C V_{tank}^2}{Q} \quad (3)$$

As Q increases, less power P is needed. As $V_{tank}$ 220 increases, more power P is needed. Also, as frequency f increases, more power P is needed to sustain oscillation in the LC tank oscillator 200.

Figure 3:
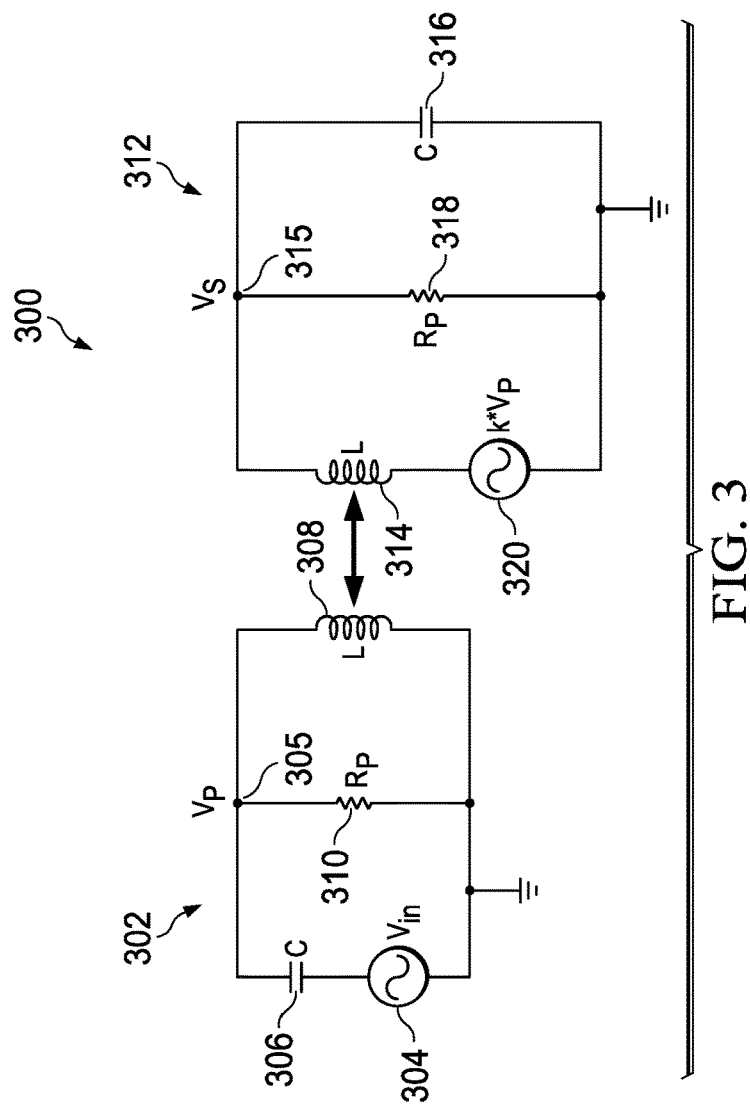
FIG. 3 is a schematic diagram of coupled LC tanks in operation of the apparatus of FIG. 1.

FIG. 3 is a schematic diagram of coupled LC tanks 300 in operation of the apparatus 100. The coupled LC tanks 300 include a primary LC tank oscillator 302 and a secondary LC tank oscillator 312. The primary LC tank oscillator 302 includes a capacitor (C) 306, an inductor (L) 308, and a voltage source (Vin) 304. The voltage across the primary LC tank oscillator 302 is $V_p$ 305. The voltage decays due to a quality factor (Q) of the primary LC tank oscillator 302, which is represented as a resistor (Rp) 310.

The secondary LC tank oscillator 312 includes a capacitor (C) 316 and an inductor (L) 314. The voltage across the secondary LC tank oscillator 312 is secondary voltage ($V_s$) 315. The voltage decays due to a quality (Q) of the secondary LC tank oscillator 312, which is represented as a resistor (Rp) 318.

The primary LC tank oscillator 302 is similar to the first circuit 115 on the first die 105, and the secondary LC tank oscillator 312 is similar to the second circuit 120 on the second die 110. In one version, the first circuit 115 includes the primary LC tank oscillator 302, and the second circuit 120 includes the secondary LC tank oscillator 312. The voltage source (Vin) 304 represents an energy source for the first circuit 115 and is configured to provide a signal to the first circuit 115. The primary LC tank oscillator 302 and the secondary LC tank oscillator 312 operate at a same fixed frequency f as one another, so they are in resonance. The fixed frequency f is also a natural frequency of oscillation of the primary LC tank oscillator 302 and of the secondary LC tank oscillator 312.

The voltage source (Vin) 304 provides a current to the primary LC tank oscillator 302. A magnetic coupling between the primary LC tank oscillator 302 and the secondary LC tank oscillator 312 induces a current in the secondary LC tank oscillator 312. In an embodiment, the voltage source (Vin) 304 provides periodic pulses of energy to the primary LC tank oscillator 302 at the fixed frequency f. In response to the periodic pulses of energy, the primary LC tank oscillator 302 oscillates at the fixed frequency f. This oscillation induces a forced oscillation in the secondary LC tank oscillator 312 via a magnetic coupling between the first circuit 115 and the second circuit 120. The magnetic coupling between the first circuit 115 and the second circuit 120 in FIG. 1 is represented by a mutual inductance of the inductor (L) 308 and the inductor (L) 314 in FIG. 3. In one example, if f=1 GHz, L=10 nH, C=2.53 pF, and Q=10, then a relatively small amount of power P for sustaining oscillation in the primary LC tank oscillator 302 (and likewise for sustaining oscillation in the secondary LC tank oscillator 312) is 800 μW, according to equation (3). Such a relatively small amount of power P is achievable even if a weak magnetic coupling exists between the primary LC tank oscillator 302 and the secondary LC tank oscillator 312. This small power P is provided as periodic pulses of energy to the first circuit 115 on the first die 105.

At a steady state, the secondary LC tank oscillator 312 operates as an LC tank oscillator with a driving voltage source 320 whose driving voltage is K*Vp, where K is a coupling coefficient between the primary LC tank oscillator 302 and the secondary LC tank oscillator 312. Accordingly, the coupled LC tanks 300 can sustain oscillation for a low coupling coefficient (K) with a reasonable amount of power. A secondary voltage (Vs) 315 across the secondary LC tank oscillator 312 is:

$$Vs = K*Vp*Q \quad (4)$$

$$Vs = K*Vin*Q*Q \quad (5)$$

$$Vs = K*Vin*Q^2 \quad (6)$$

For example, if Q=10, then 100 times voltage amplification is achievable, which can offset a low coupling coefficient (K). Accordingly, when the primary LC tank oscillator 302 and the secondary LC tank oscillator 312 operate at the same fixed frequency f as one another, the power transfer between them is highly efficient. In that situation, the primary LC tank oscillator 302 and the secondary LC tank oscillator 312 are in resonance, so the secondary voltage (Vs) 315 is stable and grows. By comparison, if the primary and secondary LC tank oscillators 302 and 312 were operating at different frequencies (e.g., non-resonant frequencies), then the secondary voltage (Vs) 315 would not grow.

Figure 4A:
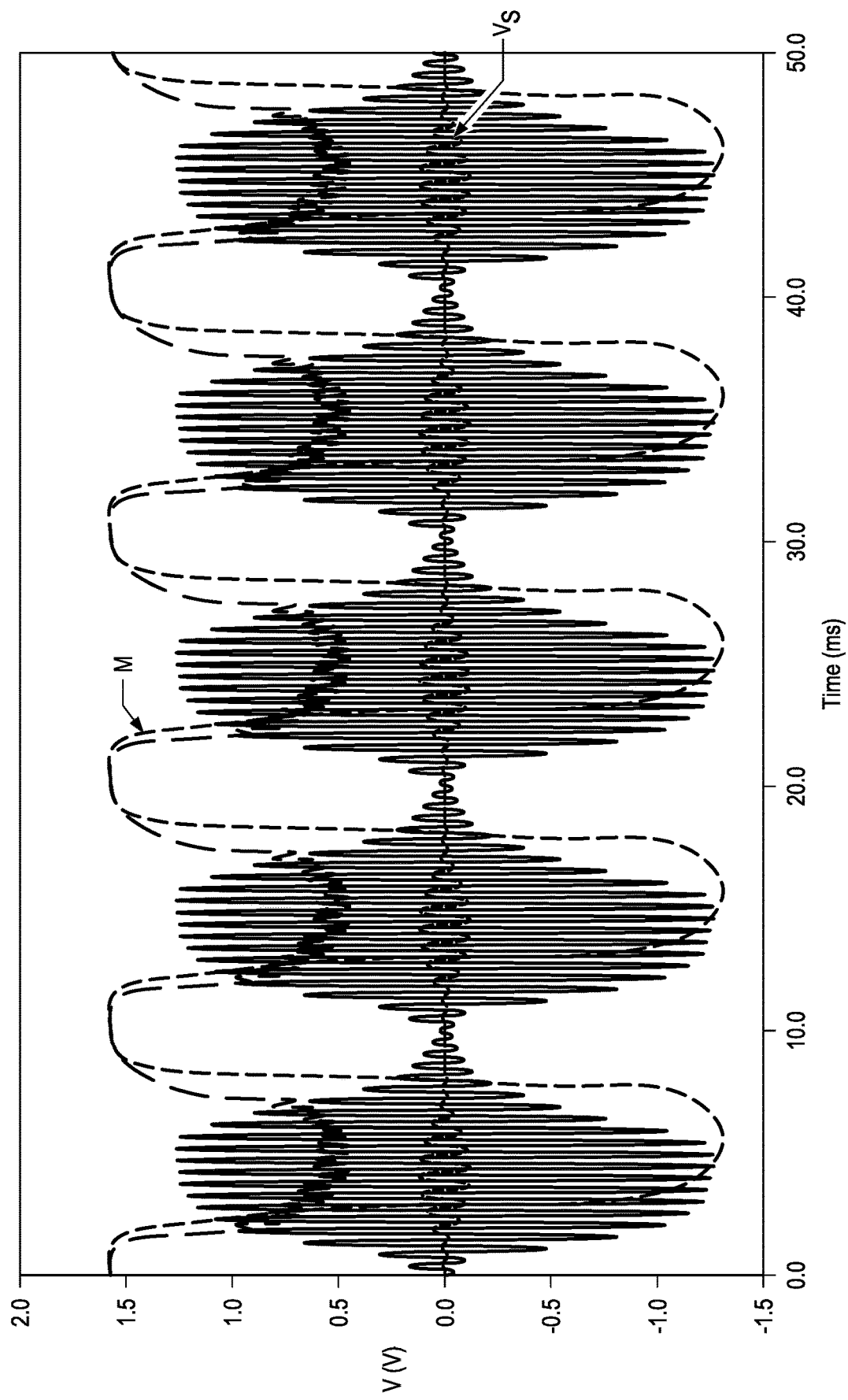
Figure 4C:
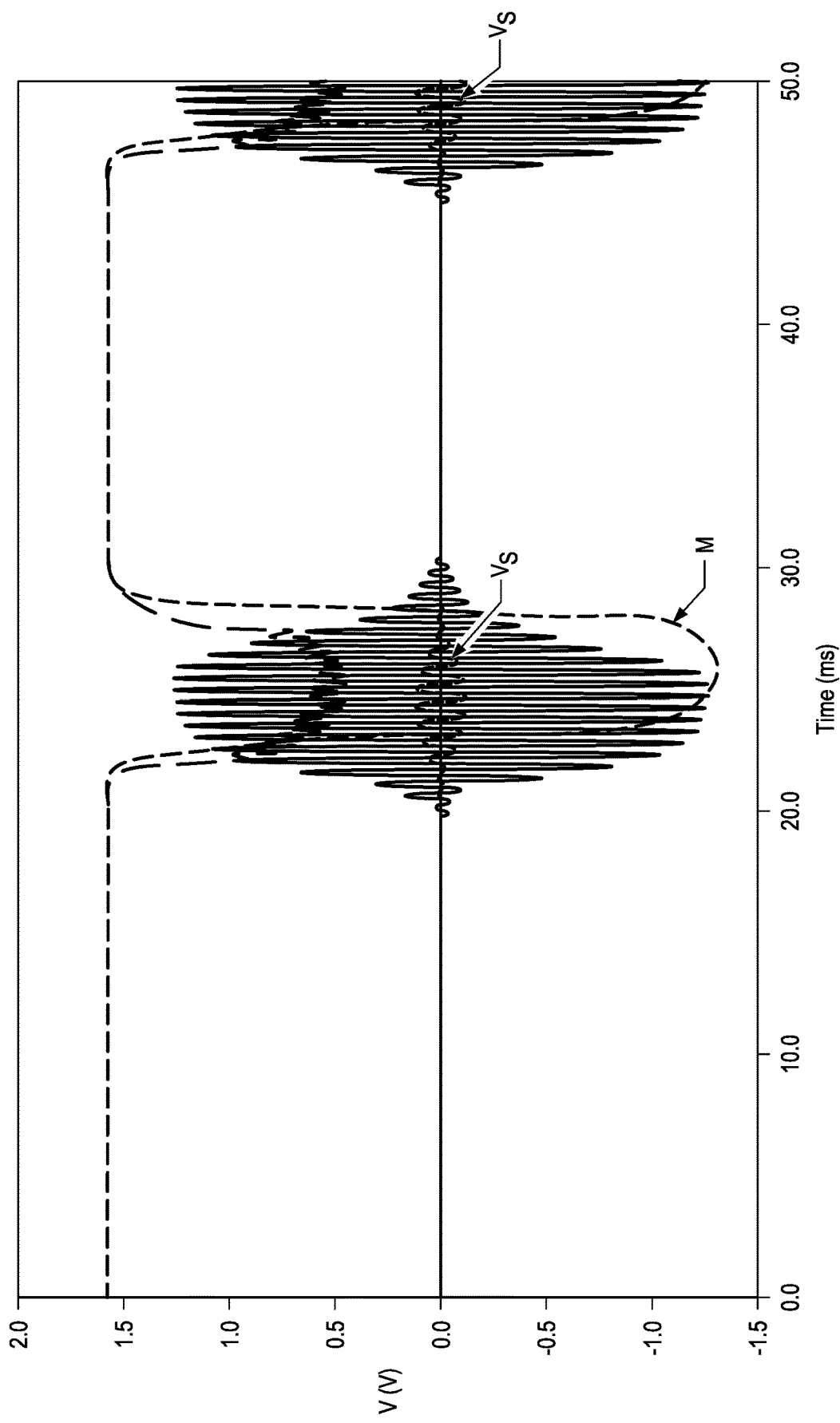

FIGS. 4A-4C are graphs of modulation operations performed in the apparatus 100. With the resonant system approach of FIG. 3, the driving current and the secondary voltage (Vs) 315 are not directly controlled, and the secondary voltage (Vs) 315 builds over multiple cycles. The current in the primary LC tank oscillator 302 is modulated for communication between the primary LC tank oscillator 302 and the secondary LC tank oscillator 312.

The current in the primary LC tank oscillator 302 is modulated using one of various modulation techniques, such as (but not limited to) on-off keying modulation, phase shift keying (PSK) modulation, amplitude modulation, phase modulation, quadrature phase shift keying (QPSK) modulation, and binary phase shift keying (BPSK) modulation. For example, in one embodiment, the current in the primary LC tank oscillator 302 is modulated using on-off keying modulation, which takes advantage of settling behavior of the coupled LC tanks 300. The secondary voltage (Vs) 315 is obtained on application of the on-off keying modulation (M).

FIG. 4A shows operation when the on-off keying modulation (M) is 010101. FIG. 4B shows operation when the on-off keying modulation (M) is 000010001000. Similarly, FIG. 4C shows operation when the on-off keying modulation (M) is 11110111101111. In an example, a transition from 1 to 0 in this modulation is reduced by placing a low resistance in parallel in the primary LC tank oscillator 302.

Figure 5:
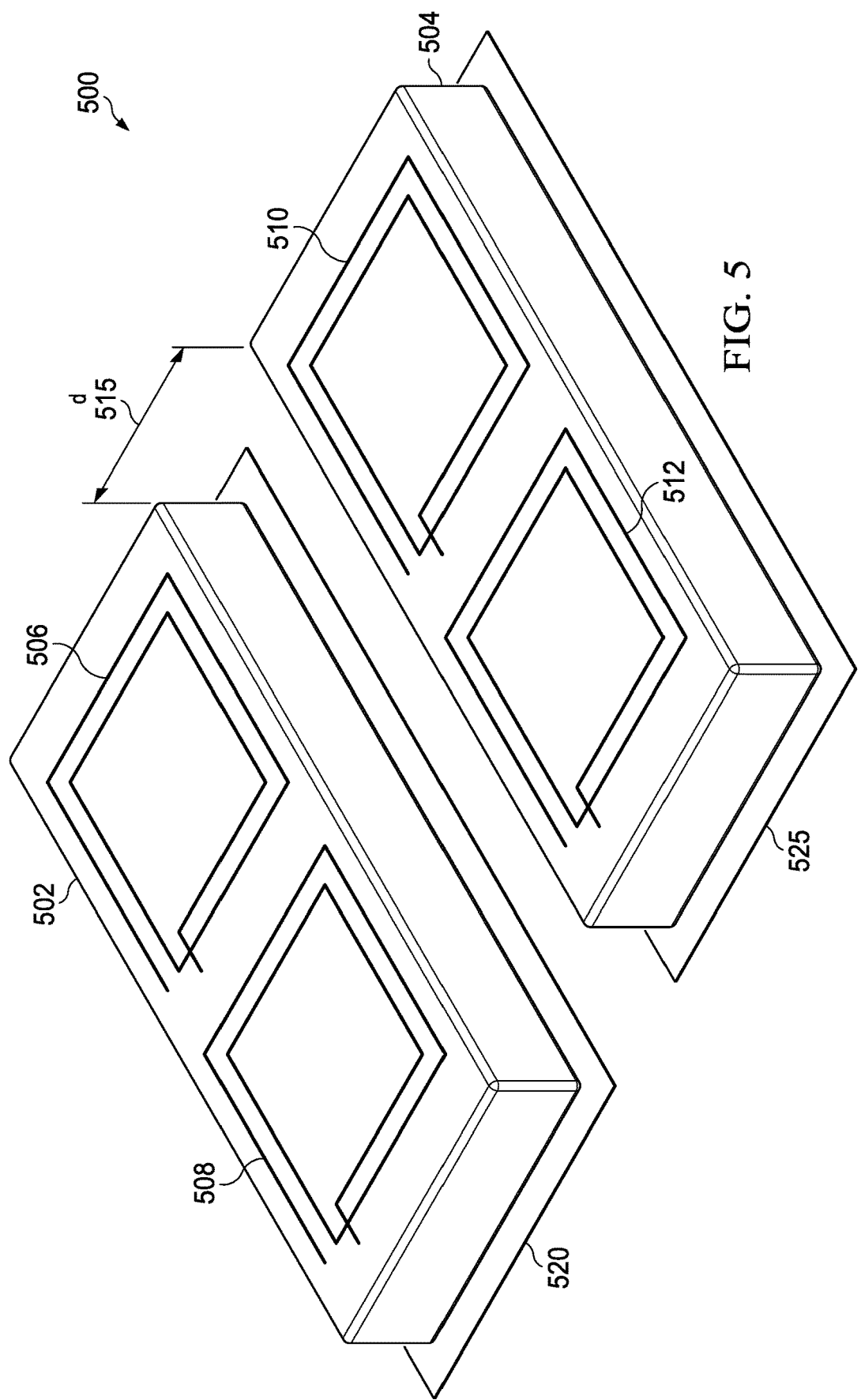
FIG. 5 is a structural perspective view of a first alternative version of the apparatus of FIG. 1.

FIG. 5 is a structural perspective view of apparatus 500, which is a first alternative version of the apparatus 100 (FIG. 1). The apparatus 500 includes at least a first die 502 and a second die 504. The first die 502 and the second die 504 are illustrative, and the apparatus 500 may include multiple die and other active/passive components. The first die 502 includes at least a first circuit 506 and a second circuit 508. The second die 504 includes at least a third circuit 510 and a fourth circuit 512. The first circuit 506 and the second circuit 508 are positioned side-by-side on the first die 502, and the third circuit 510 and the fourth circuit 512 are positioned side-by-side on the second die 504, so that: (a) an edge of the first circuit 506 is parallel to an edge of the third circuit 510; and (b) an edge of the second circuit 508 is parallel to an edge of the fourth circuit 512.

In a first embodiment, the first die 502 is integral with a first conductive pad 520, and the second die 504 is integral with a second conductive pad 525. The first conductive pad 520 and the second conductive pad 525 both include multiple grooves to substantially prevent eddy current formation on the first conductive pad 520 and the second conductive pad 525 respectively. In a second embodiment, the first die 502 is integral with a first substrate (or chip) 520, and the second die 504 is integral with a second substrate (or chip) 525. In a third embodiment, the first conductive pad 520 and the second conductive pad 525 both include multiple cuts to substantially prevent eddy current formation on the first conductive pad 520 and the second conductive pad 525 respectively. In a fourth embodiment, when each of the first die 502 and the second die 504 is integral with a non-conductive pad, the non-conductive pad may optionally omit the multiple grooves.

In one example, the first die 502 and the second die 504 are integral with a laminate, which substantially prevents eddy current formation. In another example, the first die 502 and the second die 504 are part of different packages, which are part of a PCB. In a different example, the apparatus 500 is integral with an MCM, so that the first die 502 and the second die 504 are on a single chip in the MCM. In a further example, the apparatus 500 is integral with an MCM, so that the first die 502 and the second die 504 are part of different chips in the MCM. In yet another example, the apparatus 500 is integral with a PCB.

In one version, the first die 502 is symmetrical with the second die 504. The first die 502 is coplanar to the second die 504. The first die 502 and the second die 504 are separated by a fixed distance (d) 515. In an embodiment, the first circuit 506, the second circuit 508, the third circuit 510 and the fourth circuit 512 include respective antenna coils with non-radiative dimensions (e.g., non-radiative when an electrical length of the antenna coil is less than one-eighth of an operating wavelength of the apparatus 500). In one example, the first circuit 506 and the second circuit 508 are on-chip, and their antenna coils are integral with a laminate. In one version, the second die 504 is on top of the first die 502, so that an active surface of the first die 502 is facing an active surface of the second die 504, and each of those active surfaces contains its respective antenna coil. In one embodiment, the first die 502 and the second die 504 are integral with a first package and a second package respectively. In a further example, the second package is on top of the first package, such that the active surface of the first die 502 is facing the active surface of the second die 504.

The first circuit 506 is coupled to a first energy source (not shown in FIG. 5), and the second circuit 508 is coupled to a second energy source (not shown in FIG. 5), such as a voltage source or a current source. In a first example, the first die 502 includes the first energy source and the second energy source. In a second example, the first energy source and the second energy source are external to the first die 502. In a third example, the first energy source and the second energy source are external to the apparatus 500.

The operation of the apparatus 500 is similar to the operation of the apparatus 100 (FIG. 1). The first circuit 506 and the third circuit 510 operate at a first frequency. In response to a first signal (e.g., current signal and/or voltage signal), the first circuit 506 induces a current in the third circuit 510 via a magnetic coupling between the first circuit 506 and the third circuit 510. In one example, the first signal is a periodic pulse of energy. The first signal (provided to and received by the first circuit 506) is modulated for communication between the first circuit 506 and the third circuit 510. In an embodiment, the first signal is provided to the first circuit 506 by the first energy source on the first die 502.

The second circuit 508 and the fourth circuit 512 operate at a second frequency. In response to a second signal (e.g., current signal and/or voltage signal), the second circuit 508 induces a current in the fourth circuit 512 via a magnetic coupling between the second circuit 508 and the fourth circuit 512. In one example, the second signal is a periodic pulse of energy. The second signal (provided to and received by the second circuit 508) is modulated for communication between the second circuit 508 and the fourth circuit 512. In an embodiment, the second signal is provided by the second energy source on the first die 502.

As discussed in connection with FIG. 3, when the primary LC tank oscillator 302 and the secondary LC tank oscillator 312 operate at different (e.g., non-resonant) frequencies from one another, the secondary voltage (Vs) 315 does not grow. In that manner, the apparatus 500 achieves frequency selectivity, so that communication between the first circuit 506 and the third circuit 510 does not interfere with communication between the second circuit 508 and the fourth circuit 512. Accordingly, the apparatus 500 performs multi-channel communication in which: (a) a first channel operates at the first frequency for communication between the first circuit 506 and the third circuit 510; and (b) a second channel operates at the second frequency for communication between the second circuit 508 and the fourth circuit 512.

Figure 6:
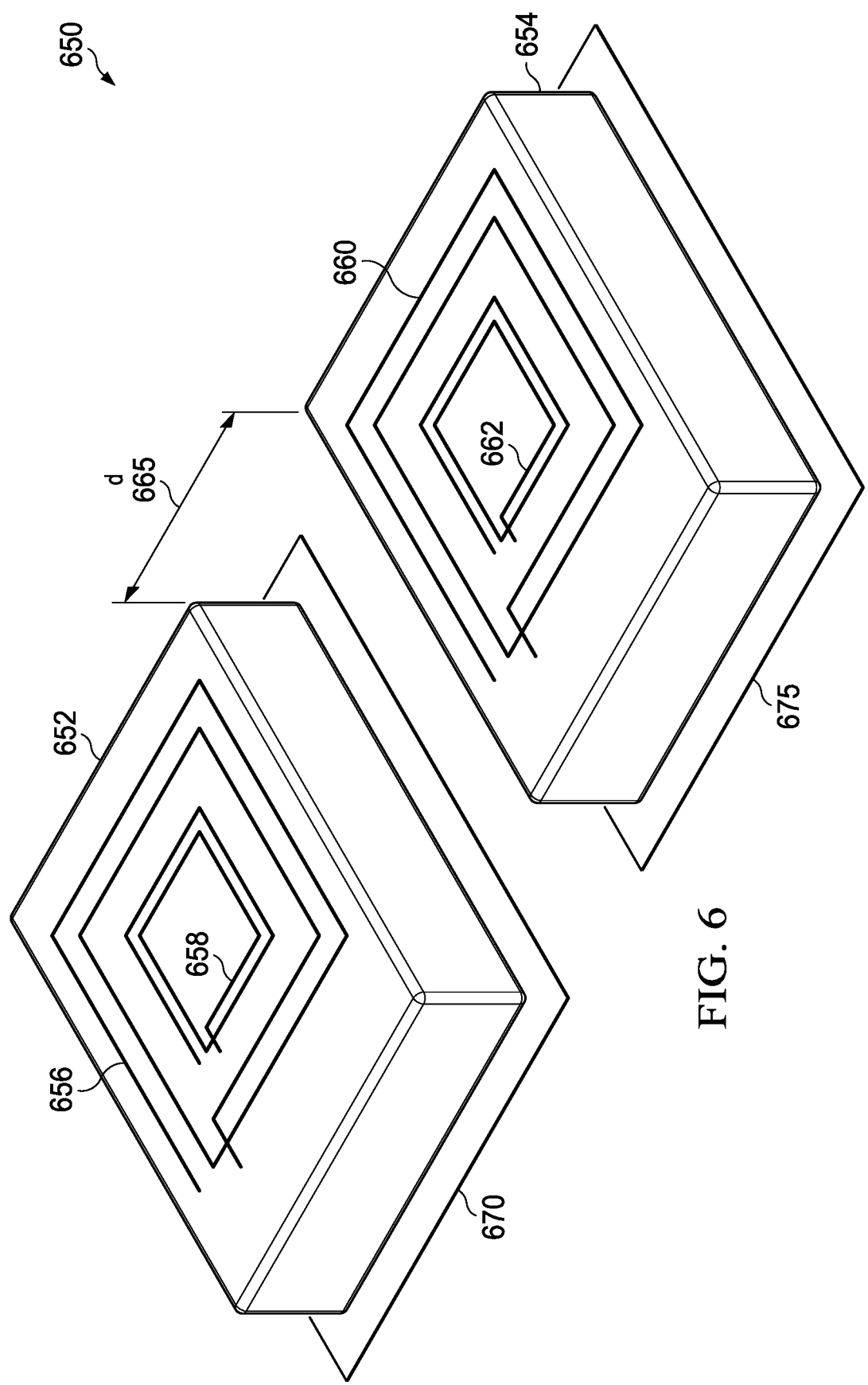
FIG. 6 is a structural perspective view of a second alternative version of the apparatus of FIG. 1.

FIG. 6 is a structural perspective view of apparatus 650, which is a second alternative version of the apparatus 100 (FIG. 1). The apparatus 650 includes at least a first die 652 and a second die 654. The first die 652 and the second die 654 are illustrative, and the apparatus 650 may include multiple die and other active/passive components. The first die 652 includes at least a first circuit 656 and a second circuit 658. The second die 654 includes at least a third circuit 660 and a fourth circuit 662. The second circuit 658 is placed within the first circuit 656 on the first die 652, and the fourth circuit 662 is placed within the third circuit 660 on the second die 654.

In a first embodiment, the first die 652 is integral with a first conductive pad 670, and the second die 654 is integral with a second conductive pad 675. The first conductive pad 670 and the second conductive pad 675 both include multiple grooves to substantially prevent eddy current formation on the first conductive pad 670 and the second conductive pad 675 respectively. In a second embodiment, the first die 652 is integral with a first substrate (or chip) 670, and the second die 654 is integral with a second substrate (or chip) 675. In a third embodiment, the first conductive pad 670 and the second conductive pad 675 both include multiple cuts to substantially prevent eddy current formation on the first conductive pad 670 and the second conductive pad 675 respectively. In a fourth embodiment, when each of the first die 652 and the second die 654 is integral with a non-conductive pad, the non-conductive pad may optionally omit the multiple grooves.

In one example, the first die 652 and the second die 654 are integral with a laminate, which substantially prevents eddy current formation. In another example, the first die 652 and the second die 654 are part of different packages, which are part of a PCB. In a different example, the apparatus 650 is integral with an MCM, so that the first die 652 and the second die 654 are on a single chip in the MCM. In a further example, the apparatus 650 is integral with an MCM, so that the first die 652 and the second die 654 are part of different chips in the MCM. In yet another example, the apparatus 650 is integral with a PCB.

In one embodiment, the first die 652 is symmetrical to the second die 654. The first die 652 is coplanar to the second die 654. The first die 652 and the second die 654 are separated by a fixed distance (d) 665. In an embodiment, the first circuit 656, the second circuit 658, the third circuit 660 and the fourth circuit 662 include respective antenna coils with non-radiative dimensions (e.g., non-radiative when an electrical length of the antenna coil is less than one-eighth of an operating wavelength of the apparatus 650). In one example, the first circuit 656 and the second circuit 658 are on-chip, and their antenna coils are integral with a laminate.

In one version, the second die 654 is on top of the first die 652, so that an active surface of the first die 652 is facing an active surface of the second die 654, and each of those active surfaces contains its respective antenna coil. In one embodiment, the first die 652 and the second die 654 are integral with a first package and a second package respectively. In a further example, the second package is on top of the first package, such that the active surface of the first die 652 is facing the active surface of the second die 654.

The first circuit 656 is coupled to a first energy source (not shown in FIG. 6), and the second circuit 658 is coupled to a second energy source (not shown in FIG. 6), such as a voltage source or a current source. In a first example, the first die 652 includes the first energy source and the second energy source. In a second example, the first energy source and the second energy source are external to the first die 652. In a third example, the first energy source and the second energy source are external to the apparatus 650.

The operation of the apparatus 650 is similar to the operation of the apparatus 100 (FIG. 1). The first circuit 656 and the third circuit 660 operate at a first frequency. In response to a first signal (e.g., current signal and/or voltage signal), the first circuit 656 induces a current in the third circuit 660 via a magnetic coupling between the first circuit 656 and the third circuit 660. In one example, the first signal is a periodic pulse of energy. The first signal (provided to and received by the first circuit 656) is modulated for communication between the first circuit 656 and the third circuit 660. In an embodiment, the first signal is provided to the first circuit 656 by the first energy source on the first die 652.

The second circuit 658 and the fourth circuit 662 operate at a second frequency. In response to a second signal (e.g., current signal and/or voltage signal), the second circuit 658 induces a current in the fourth circuit 662 via a magnetic coupling between the second circuit 658 and the fourth circuit 662. In one example, the second signal is a periodic pulse of energy. The second signal (provided to and received by the second circuit 658) is modulated for communication between the second circuit 658 and the fourth circuit 662. In an embodiment, the second signal is provided by the second energy source on the first die 652.

As discussed in connection with FIG. 3, when the primary LC tank oscillator 302 and the secondary LC tank oscillator 312 operate at different (e.g., non-resonant) frequencies from one another, the secondary voltage (Vs) 315 does not grow. In that manner, the apparatus 650 achieves frequency selectivity, so that communication between the first circuit 656 and the third circuit 660 does not interfere with communication between the second circuit 658 and the fourth circuit 662. Accordingly, the apparatus 650 performs multi-channel communication in which: (a) a first channel operates at the first frequency for communication between the first circuit 656 and the third circuit 660; and (b) a second channel operates at the second frequency for communication between the second circuit 658 and the fourth circuit 662.

Figure 7:
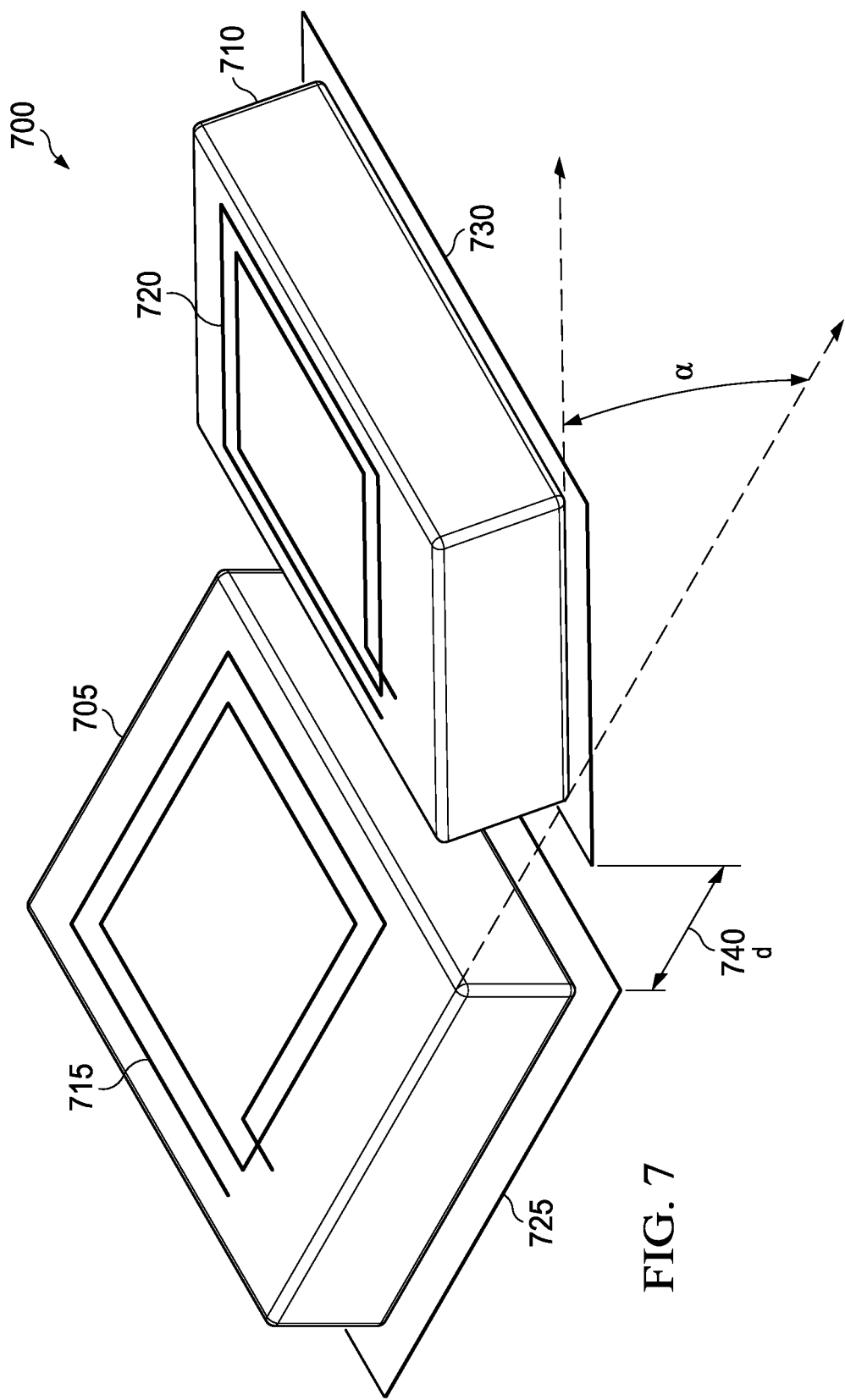
FIG. 7 is a structural perspective view of a third alternative version of the apparatus of FIG. 1.

FIG. 7 is a structural perspective view of apparatus 700, which is a third alternative version of the apparatus 100 (FIG. 1). The apparatus 700 includes at least a first die 705 and a second die 710. The first die 705 and the second die 710 are illustrative, and the apparatus 700 may include multiple die and other active/passive components. The first die 705 includes at least a first circuit 715, and the second die 710 includes at least a second circuit 720.

In a first embodiment, the first die 705 is integral with a first conductive pad 725, and the second die 710 is integral with a second conductive pad 730. The first conductive pad 725 and the second conductive pad 730 both include multiple grooves to substantially prevent eddy current formation on the first conductive pad 725 and the second conductive pad 730 respectively. In a second embodiment, the first die 705 is integral with a first substrate (or chip) 725, and the second die 710 is integral with a second substrate (or chip) 730. In a third embodiment, the first conductive pad 725 and the second conductive pad 730 both include multiple cuts to substantially prevent eddy current formation on the first conductive pad 725 and the second conductive pad 730 respectively. In a fourth embodiment, when each of the first die 705 and the second die 710 are integral with a non-conductive pad, the non-conductive pad may optionally omit the multiple grooves.

In one example, the first die 705 and the second die 710 are integral with a laminate, which substantially prevents eddy current formation. In a further example, the first die 705 and the second die 710 are part of different packages, which are part of a PCB. In another example, the apparatus 700 is integral with an MCM, so that the first die 705 and the second die 710 are on a single chip in the MCM. In a different example, the apparatus 700 is integral with an MCM, so that the first die 705 and the second die 710 are part of different chips in the MCM. In yet another example, the apparatus 700 is integral with a PCB.

The second die 710 is positioned at a fixed angle ($\alpha$) relative to the first die 705. In one example, the fixed angle ($\alpha$) is 180 degrees. In another example, the fixed angle ($\alpha$) is an integer multiple of 45 degrees. In one version, the first die 705 is symmetrical with the second die 710, so that dimensions (e.g., length, width and height) of the first die 705 are same as dimensions of the second die 710. The first die 705 and the second die 710 are separated by a fixed distance (d) 740. In one example, the fixed distance (d) 740 is more than 0.5 mm. In a further example, the fixed distance (d) 740 varies from 0.5 mm to 7 mm (millimeters). In another example, the fixed distance (d) 740 is such that a high voltage isolation (e.g., above 7.5 kilovolt) is maintained between the first die 705 and the second die 710.

The first circuit 715 and the second circuit 720 include respective antenna coils with non-radiative dimensions (e.g., non-radiative when an electrical length of the antenna coil is less than one-eighth of an operating wavelength of the apparatus 700). In one example, the first circuit 715 is on-chip, and its antenna coil is integral with a laminate. In another example, the antenna coil is a flat coil (e.g., flat spiral coil) having N number of loops in one plane, where N is an integer. In one embodiment, the first die 705 and the second die 710 are integral with a first package and a second package respectively. In a further example, the second package is on top of the first package, such that the active surface of the first die 705 is facing the active surface of the second die 710.

In an embodiment, the loops of the antenna coil and a capacitor together operate as an LC tank (inductor capacitor tank) oscillator. In one example, each of the first circuit 715 and the second circuit 720 includes a respective LC tank oscillator that is formed by a set of inductors and a set of capacitors. Also, each of the first circuit 715 and the second circuit 720 includes a respective transmitter and a respective receiver, which are used for communication between the first die 705 and the second die 710.

The first circuit 715 is coupled to an energy source (not shown in FIG. 7), such as a voltage source or a current source. In a first example, the first die 705 includes the energy source. In a second example, the energy source is external to the first die 705. In a third example, the energy source is external to the apparatus 700. The operation of the apparatus 700 is similar to the operation of the apparatus 100 (FIG. 1).

Modifications are possible in the described embodiments, and other embodiments are possible, within the scope of the claims.

What is claimed is:

1. Apparatus comprising:
a first die including: a first primary LC tank (inductor capacitor tank) oscillator having a first natural frequency of oscillation configured to induce a first forced oscillation in a first secondary LC tank oscillator of a separate second die via a first magnetic coupling between the first primary LC tank oscillator and the first secondary LC tank oscillator; and a second primary LC tank oscillator having a second natural frequency of oscillation configured to induce a second forced oscillation in a second secondary LC tank oscillator of the second die via a second magnetic coupling between the second primary LC tank oscillator and the second secondary LC tank oscillator.

2. The apparatus of claim 1, wherein the first primary LC tank oscillator is configured to oscillate at the first natural frequency in response to a first signal from a first energy source, and the second primary LC tank oscillator is configured to oscillate at the second natural frequency in response to a second signal from a second energy source.

3. The apparatus of claim 2, wherein the first signal is modulated to communicate from the first primary LC tank oscillator to the first secondary LC tank oscillator via the first magnetic coupling, and the second signal is modulated to communicate from the second primary LC tank oscillator to the second secondary LC tank oscillator via the second magnetic coupling.

4. The apparatus of claim 1, wherein the first primary LC tank oscillator and the second primary LC tank oscillator are side-by-side on the first die, such that an edge of the first primary LC tank oscillator is parallel to an edge of the second primary LC tank oscillator.

5. The apparatus of claim 1, wherein the first die includes the first primary LC tank oscillator having the first natural frequency of oscillation configured to induce the first forced oscillation in the first secondary LC tank oscillator of the second die coplanar to the first die.

6. The apparatus of claim 1, wherein the first die includes the first primary LC tank oscillator having the first natural frequency of oscillation configured to induce the first forced oscillation in the first secondary LC tank oscillator of the second die at a fixed angle to the first die.

7. The apparatus of claim 1, wherein the first die includes the first primary LC tank oscillator having the first natural frequency of oscillation configured to induce the first forced oscillation in the first secondary LC tank oscillator of the second die separated by a fixed distance from the first die.

8. The apparatus of claim 1, wherein the first die includes: a first antenna coil to communicate from the first primary LC tank oscillator to the first secondary LC tank oscillator via the first magnetic coupling; and a second antenna coil to communicate from the second primary LC tank oscillator to the second secondary LC tank oscillator via the second magnetic coupling.

9. The apparatus of claim 8, wherein the first and second antenna coils have non-radiative dimensions.

10. The apparatus of claim 1, wherein the first die is integral with a conductive pad that includes grooves to prevent eddy current formation on the conductive pad.

11. The apparatus of claim 1, wherein the first natural frequency is a first fixed frequency, and the second natural frequency is a second fixed frequency.

12. The apparatus of claim 1, wherein the first forced oscillation includes a first current oscillation, and the second forced oscillation includes a second current oscillation.

* * * * *